United States Patent
Harris et al.

(10) Patent No.: US 10,464,315 B1
(45) Date of Patent: Nov. 5, 2019

(54) METHOD FOR GENERATING VARIABLE LENGTH STROBE PULSES WITH REFERENCE TO IMAGE DISTANCE

(71) Applicant: Xerox Corporation, Norwalk, CT (US)

(72) Inventors: William R. Harris, Rochester, NY (US); Patrick Shuman, Rochester, NY (US); James L. Pratt, Penfield, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 16/019,927

(22) Filed: Jun. 27, 2018

(51) Int. Cl.
*B41J 2/045* (2006.01)
*H05K 3/12* (2006.01)

(52) U.S. Cl.
CPC ....... *B41J 2/04541* (2013.01); *B41J 2/04586* (2013.01); *H05K 3/125* (2013.01); *H05K 2203/013* (2013.01); *H05K 2203/1131* (2013.01)

(58) Field of Classification Search
CPC ... B41J 2/04541; B41J 2/04586; H05K 3/125; H05K 2203/013; H05K 2203/1131
See application file for complete search history.

(56) References Cited

U.S. PATENT DOCUMENTS

| | | | |
|---|---|---|---|
| 5,988,785 A | 11/1999 | Katayama | |
| 6,913,345 B2 | 7/2005 | Parish et al. | |
| 7,029,084 B2 | 4/2006 | Schloeman et al. | |
| 7,090,338 B2 | 8/2006 | Axtell et al. | |
| 7,350,888 B2 | 4/2008 | Barkley et al. | |
| 9,289,978 B2 * | 3/2016 | Benjamin | B41J 2/04541 |

* cited by examiner

*Primary Examiner* — Thinh H Nguyen
(74) *Attorney, Agent, or Firm* — Maginot Moore & Beck LLP

(57) ABSTRACT

A method of operating a printer enables activation signals of variable lengths to be generated for operation of a sintering head. The activation signals are generated with reference to a distance between activation signals for a first component to be a first determined distance and a duration of the activation signals for the first component to be longer than the first predetermined distance. This distance and duration are set to values that enable the generation of activation signals before the first predetermined distance is reached to maintain an activation signal until the generation of the activation signals is terminated. By generating a different number of activation signals, the duration of an initial activation signal can be varied.

22 Claims, 4 Drawing Sheets

METHOD FOR GENERATING VARIABLE LENGTH STROBE PULSES WITH REFERENCE TO IMAGE DISTANCE

TECHNICAL FIELD

This disclosure relates generally to printing systems, and more particularly, to controlling substrate processing components in such printing systems.

BACKGROUND

In printing systems, printheads and substrates on which they print move relative to one another. To synchronize the emission of the material from the printheads to particular locations on the substrates, clocks, devices that measure substrate movement distances, and position detectors are used. The signals generated by these components are received by a controller and analyzed to determine the speed of a moving substrate or printhead and to determine a future time at which an ejector in the printhead is opposite a particular position where material should be ejected. A signal that activates the ejector is sent to the ejector immediately before that position is reached so the ejector is activated to eject a drop of material at the predetermined position.

In some known inkjet printers, the signals that activate ejectors in printheads are called DotClock signals. These DotClock signals are typically based on positional input from an encoder that is associated with a roller that moves a substrate through the printer prior to the substrate being printed. These rotary encoders are optical or electromagnetic sensors that convert the angular position of the roller from an index position into an electrical signal. With information regarding the radius or diameter of the roller along with the current angular position, the controller can determine when a portion of the substrate currently at the roller is positioned elsewhere in the printer. This positional data, rather than strictly time-based data, is used so variation in the substrate transport speed can be taken into account, which results in significant accuracy of substrate location positions. In other known systems, a linear encoder is used to convert the linear position of a tag on a component carrying a substrate as the component moves through the system into an electrical signal that is used as positional data for substrate movement.

Printing system technology has been adapted to form electronic circuits on flexible substrates. In these printing systems, a printhead array ejects conductive ink onto the flexible substrates to form ink images of electronic traces on the substrates. The printed flexible substrates bearing the liquid ink images of the electronic traces are then moved past a sintering head that exposes the liquid ink image to an intense light that hardens the liquid ink and bonds the traces to the substrate. The substrates continue to move past the sintering head to another machine that populates the flexible substrates with electronic components and applies solder to install the components in the electronic traces. The completed flexible substrates can then be installed in devices. Operating the lamps in sintering heads differs from known printhead activation technology because the DotClock signals for inkjet printheads react to the rising edge of the signal and the duration of the pulse in the signal is not important. The lamps in the sintering heads, however, require the activation signal to remain at the activating amplitude to keep the lamp shining while the printed circuits are opposite the lamps. The DotClock signal in known inkjet printers provide a rising edge that precisely indicates that a position on a substrate has traveled a specific distance and reached a particular location at a specific point in time. This signal, however, does not have to maintain the amplitude present at the rising edge for the ejector since it only ejects one drop and does not eject another drop until another DotClock signal is received. Rather than redesigning the DotClock signal generator that drives a sintering head so it produces activation signals for the lamps in sintering heads that correspond to different periods of illumination for different lengths of circuits formed on flexible substrates, a less drastic modification of the DotClock signal generator operation would be beneficial.

SUMMARY

A method of operating a printer enables a sintering head activation signal to be varied with different durations without significant alteration of known inkjet ejector activation signal generators. The method includes setting a distance between generation of activation signals for a first component to be a first determined distance, setting a duration of each activation signal for the first component to be longer than a time period corresponding to the first predetermined distance, identifying a number of activation signals that operate the first component for processing a predetermined length of a substrate, generating a first activation signal for the first component in response to the substrate reaching the first component, and continuing to generate additional activation signals for the first component as the first predetermined distance is reached following generation of each activation signal until the identified number of activation signals have been generated.

A system that exposes substrates having variable lengths to radiation emitted by a curing device enables a curing device activation signal to be varied with different durations without significant alteration of known inkjet ejector activation signal generators. The system includes a cart configured to move the substrate along a track past a first component, a first component configured to treat the substrate as the cart passes the first component, and a controller. The controller is configured to set a distance between generation of activation signals for the first component to be a first determined distance, set a duration of each activation signal for the first component to be longer than a time period corresponding to the first predetermined distance, identify a number of activation signals that operate the first component for processing a predetermined length of a substrate, generate a first activation signal for the first component as the substrate approaches the first component, and continue to generate additional activation signals for the first component as the first predetermined distance is reached following generation of each activation signal until the identified number of activation signals have been generated.

A printing system for producing printed circuits on substrates enables a sintering head activation signal to be varied with different durations without significant alteration of known inkjet ejector activation signal generators. The printing system includes a cart configured to move the substrate along a track past a sintering head, a sintering head configured to treat an electrical circuit on the substrate, and a controller. The controller is configured to set a distance between generation of activation signals for the sintering head to be a first determined distance, set a duration of each activation signal for the sintering head to be longer than a time period corresponding to the first predetermined distance, identify a number of activation signals that operate the sintering head for processing a predetermined length of a substrate, generate a first activation signal for the sintering head as the substrate approaches the sintering head, and continue to generate additional activation signals for the sintering head as the first predetermined distance is reached following generation of each activation signal until the identified number of activation signals have been generated.

BRIEF DESCRIPTION OF THE DRAWINGS

The foregoing aspects and other features of a method and system that enables a sintering head activation signal to have a variable duration without significant alteration of known inkjet ejector activation signal generators are explained in the following description taken in connection with the accompanying drawings.

DETAILED DESCRIPTION

Figure 1:
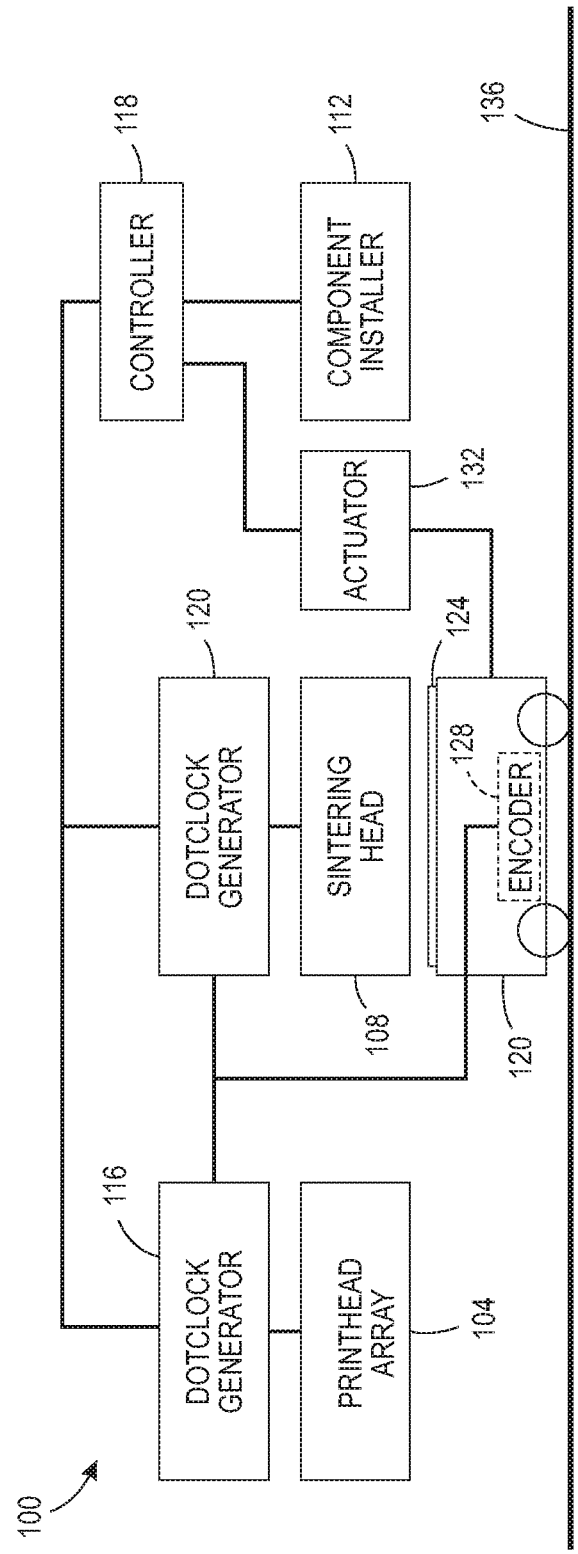
FIG. 1 is a block diagram of an improved printed circuit board manufacturing system that uses a DotClock generator to produce activation signals having variable durations.

A system for manufacturing printed circuits on flexible substrates is shown in FIG. 1. The system 100 includes a printhead array 104, a sintering head 108, an electronic component installer 112, and a controller 118. Controller 118 operates an actuator 132 to propel a cart 120 along a track 136 in a process direction to move a flexible substrate 124 held to its upper surface past the printhead array 104, the sintering head 108, and the electronic component installer 112. Detectable marks are located at precise intervals on the track 136 and an encoder 128 is mounted to the cart 120 to detect the marks and generate a signal indicating detection of a mark. An unique index mark is provided in the detectable mark and it is used as a fixed position reference when detected by the encoder. Prior to sending the cart 120 and the substrate 124 through the system 100, the controller 118 sends data to the DotClock generator 116 and the DotClock generator 120 identifying the number of marks past the index mark these generators are to begin generating activation signals for the operation of the printhead array 104 and the sintering head 108, respectively. As used in this document, the term "process direction" refers to the direction of movement of flexible substrates past the printhead array 104, the sintering head 108, and the electronic component installer 112 to the discharge area from the system 100, while the term "cross-process direction" refers to a bidirectional path of movement that is perpendicular to the process direction in the plane of the flexible substrates. The movement of the cart 120 along track 136 is in the process direction and the movement of the printhead array 104 across a width of the substrate 124 is in the cross-process direction.

The printhead array 104 is comprised of one or more known inkjet printheads that are operated in a known manner to eject drops of conductive ink onto flexible substrates as the substrates are moved opposite the printheads. The conductive inks ejected by the printhead array 104 contain electrically conductive particles suspended in a fluid medium. As the cart 120 carries the flexible substrate 124 past the printhead array 104, the DotClock generator 116 generates activation signals for the firing of the inkjets in the printheads based on signals from the encoder 128 and a reference clock. As discussed previously, these activation signals have a predetermined duration that cannot be varied in length to correspond to different illumination periods and these signals are time-based. The printhead array 104 can also be moved in the cross-process direction to enable finer resolution of the ejected drops per unit of distance. For example, printheads in the array 104 can be configured to eject drops at a resolution of 300 drops per inch (dpi). By moving the printheads in the cross-process direction a distance approximately one half of the distance between adjacent ink drops in a line extending in the cross-process direction, the resolution of the line of drops can be increased to 600 dpi. Even finer movement of the printheads in the cross-process direction can increase the resolution to 1200 dpi or up to 2400 dpi.

After the electrical circuits are formed with the conductive inks on the flexible substrate, the controller 118 operates the actuator 132 to move the cart 120 and the substrate 124 through the sintering head 108 and on to the component installer 112. The sintering head 108 is a device having a plurality of lamps mounted within a hood. These lamps extend in a linear array in the cross-process direction. An example of a sintering head is a PulseForge tool available from Novacentrix of Austin, Tex. These lamps continuously generate a light strobe as long as they receive an activation signal of a predetermined amplitude. The light emitted by the lamps in the sintering head 108 transforms the liquid conductive ink to a solid and bonds the metal particles in the conductive ink to the flexible substrate. This operation forms electrical circuit traces on the flexible substrates in the pattern of conductive ink printed by the printhead array 104. Activation signals for the lamps in the sintering head 108 are generated by the DotClock generator 120 and this DotClock generator 120 receives positional data signals from the encoder 128 to determine the position of the flexible substrate as it approaches the sintering head 108. The DotClock generator 120 is different than the DotClock generator 116 because the generator 120 can produce activation signals having variable durations as described more fully below.

The cart 120 and the flexible substrate 124 bearing the hardened electrical circuits leave the sintering head 108 and continue along the track 136 to the component installer 112. Component installer 112 is a known device that uses an articulated arm or the like to install electronic components at appropriate locations on a printed circuit and solder the components to those locations. When all of the components have been installed and soldered on the circuit, the cart 120 carries the flexible substrate to a location for off-loading and then the cart 120 returns to the starting position on the track 136 for another substrate.

Operation of the printhead array 104 depends upon the DotClock generator 116, which is configured to determine when an inkjet activation signal should be generated and delivered to an inkjet in a printhead in array 104 for firing the inkjet. This determination is made with reference to a predetermined distance between activation signals, which are also called DotClock signals, and the number of DotClock signals to generate. When the first DotClock signal is generated and delivered to an inkjet, a counter adds the predetermined distance to the current encoder value to obtain the encoder value for the generation of the next activation signal. This process continues until the electrical circuit has been printed and data processing for the next flexible substrate begins. When each activation signal is generated and delivered, the rising edge of each signal becomes high for a fixed amount of time but that signal duration does not further activate the ejector receiving it. This high signal duration is normally acceptable for ejectors that eject a predetermined amount of liquid ink. When the duration of the activation signal becomes important, as it does for operation of a sintering head to provide different periods of illumination, the arbitrary activation pulse duration results in improper circuit trace formation since the signal amplitude drops to zero before the next activation signal generation position is reached. Adding another register in a DotClock generator to specify a variable duration of a single activation signal that maintains the high state of the signal for the length of the circuit could solve this problem but this solution requires additional memory as well as changes to both the DotClock generator software and to the field programmable gate array (FPGA) operating the DotClock generator. Also, this type of signal generation is time-based rather than position-based and is susceptible to slips and other changes in the constant velocity of substrate movement caused by the positional components moving the substrates through the sintering head. These velocity changes adversely affect the operation of a sintering head. In general, a time-based tracking system is only accurate if velocity remains constant. Variations in velocity, which are unavoidable in known systems, produce error in tracking a substrate when the tracking is done in the time-domain.

To address the need to have an activation signal with a variable duration for operating a sintering head or the like, a method operates the DotClock generator 120 to produce activation signals with different durations. As noted previously, the DotClock generator 120 receives data identifying a number of marks past the index mark where the cart and substrate reach the sintering head 108 and it also receives data identifying the number of activation signals required to keep the sintering head 108 operating as the printed circuit passes the sintering head.

As the cart 120 moves along the track 136, the DotClock generator 120 receives the signal from the encoder 128 and identifies when the flexible substrate 124 reaches the sintering head 108. The encoder 128 could be a rotary encoder associated with a wheel or other rotating component of the cart but since the movement of the cart is along a linear track, a linear encoder is used in the system of FIG. 1 to detect the marks along the track path. Once the circuit on the substrate 124 is in position for exposure, the DotClock generator 120 generates the first activation signal of the identified number of activation signals. To maintain this activation or DotClock signal long enough to expose the entire length of the circuit without requiring the changes noted above to existing DotClock generators, two parameters used for operation of the FPGA are adjusted to adapt the printhead controller to this purpose. One of these parameters is signal duration. By setting the signal duration to be longer than the distance between generation of the activation signals, another activation signal is generated before the previous activation signal has terminated. Generating each activation signal of the identified number of activation signals as the distance between each signal generation is reached enables the active state of the first activation signal to be maintained until the last activation signal expires. Thus, a single long activation signal is produced by the DotClock generator 120 and its length depends upon the number of activation signals generated. Because the activation signal duration is maintained by the continued generation of activation signals, which are generated with reference to the distance to the next signal and the position signal received from the encoder 128, this single activation pulse is based on solely on positional data from the encoder. Thus, this extended signal very accurately locates the beginning and the end of the exposure length for a circuit on a substrate. Resolution for the length of this pulse is limited only by the setting of the distance between activation signals. This method does not require a unique signal duration parameter, which is assigned different values by software for different substrates. Instead, the method only requires that the signal duration be set to a fixed value larger than the distance between the generation of DotClock signals in constant-strobe mode or to a short duration in normal mode used for activating inkjets in printheads.

Figure 2:
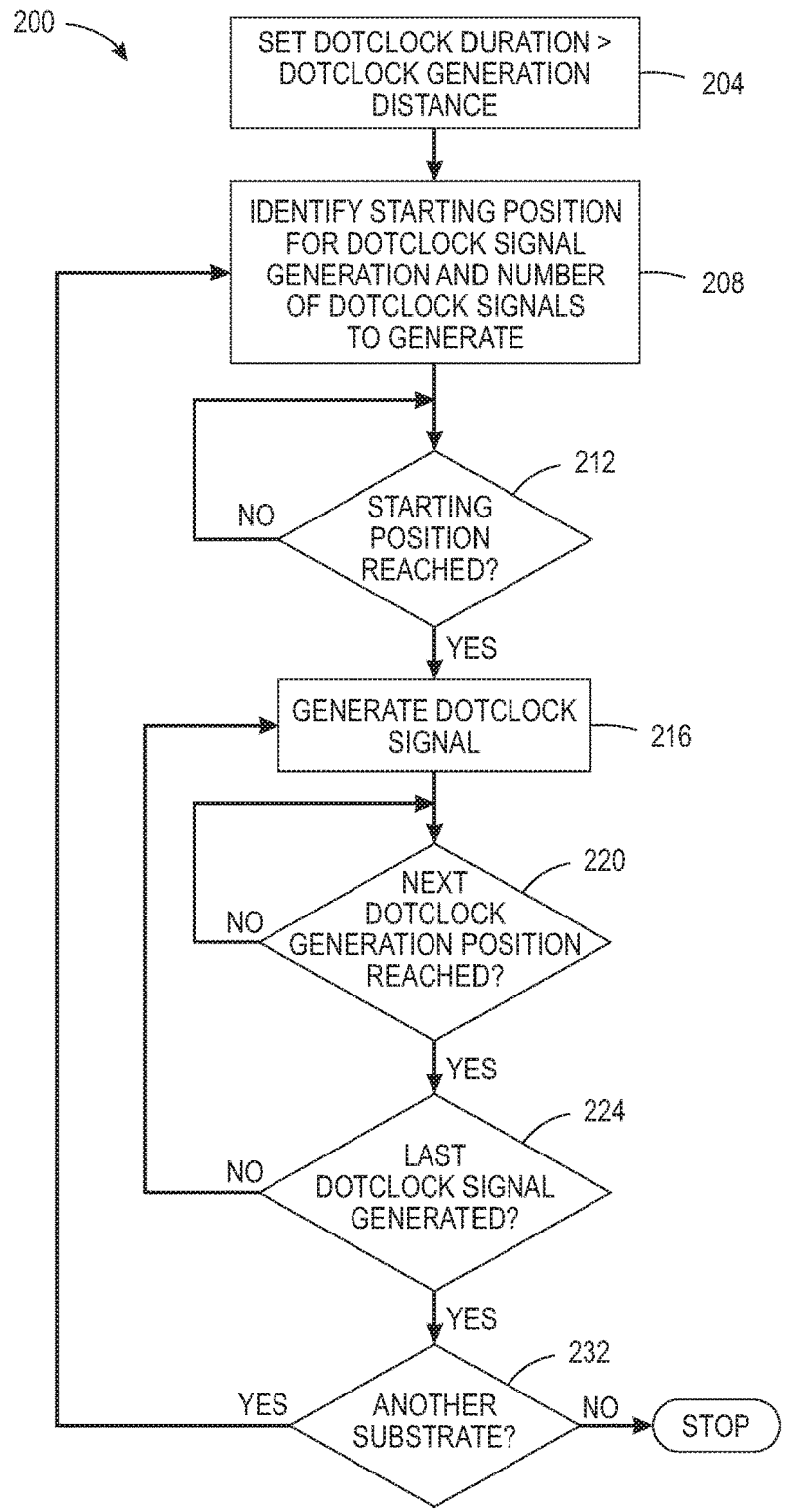
FIG. 2 is a flow diagram of a method for operating a DotClock generator to produce activation signals having variable durations.

A process for operating the DotClock generator 120 in the system 100 is shown in FIG. 2. In the description of the process, statements that the process is performing some task or function refers to a controller or general purpose processor executing programmed instructions stored in non-transitory computer readable storage media operatively connected to the controller or processor to manipulate data or to operate one or more components in the printer to perform the task or function. A controller for the system 100 noted above can be a FPGA. Alternatively, the controller can be implemented with one or more processors operating associated circuitry and components, each of which is configured to form one or more tasks or functions described herein. Additionally, the steps of the process may be performed in any feasible chronological order, regardless of the order shown in the figures or the order in which the processing is described.

The method shown in FIG. 2 begins with setting the duration of the DotClock signal for the activation signals generated by the DotClock generator 120 for the sintering head to be longer than the distance between the generation of activation signals (block 204). This setting can be done in response to a check of the data stored in an internal register or with reference to a signal generated by a hardware switch. Prior to the controller 118 operating the actuator 132 to move the cart 120 through the system 100, the process determines the position past the index mark at which activation signal generation begins and the number of activation signals needed to expose the circuit on the substrate (block 208). As the DotClock generator monitors the signal from the encoder 128, the process determines whether a printed substrate is entering the sintering head (block 212). If it is not, it waits until a printed substrate is ready to enter the sintering head. Once the positional data from the encoder indicates a printed substrate is ready to enter the sintering head, the first activation signal is generated (block 216). The DotClock output to the sintering head goes high and the process begins checking whether the distance between activation signals has been reached (block 220). Once the activation signal distance is reached, the process determines whether the last activation signal has been generated (block 224). If it has not been generated, then another activation signal is generated (block 216) to keep the DotClock output high while the substrate is opposite the sintering head. Once the last activation signal is generated (block 224), no further activation signals are generated after the expiration of that last signal and the DotClock output falls to zero. The process then determines whether another substrate is to be processed (block 232) and, if it is, the process identifies the first DotClock signal generation position for the next circuit and the number of DotClock signals needed to expose the entire length of the circuit on the printed substrate (block 208).

Otherwise, no further printed substrates remain for processing and the process is terminated.

Figure 3:
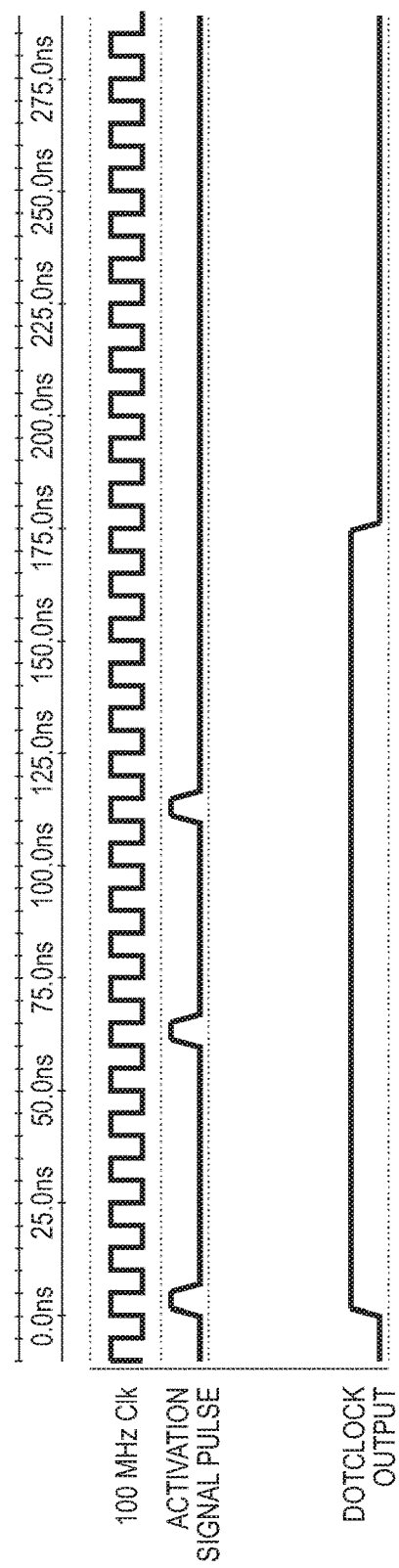
FIG. 3 is a timing diagram of the activation signals generated to produce DotClock signals of different durations.
Figure 4:
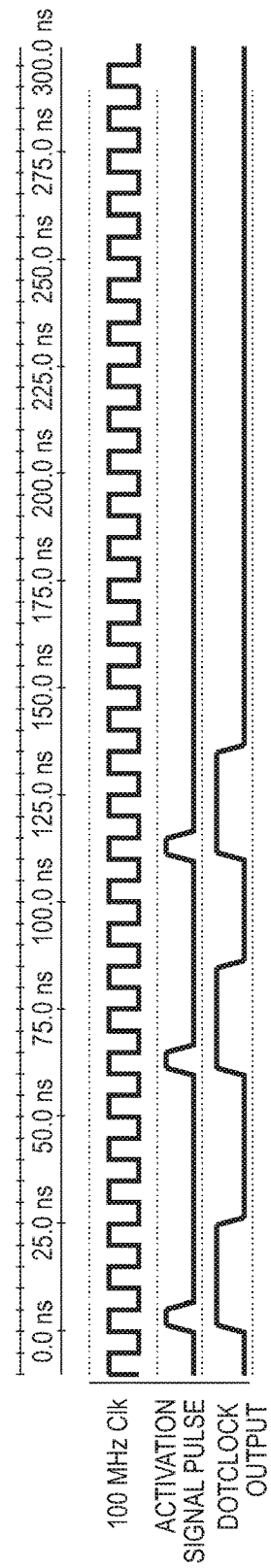
FIG. 4 is a timing diagram of a prior art DotClock generator that produces DocClock signals of a same duration.

The previously known DotClock signal generator 116 operates as shown in FIG. 4. With reference to a 100 MHz clock, activation signals are generated approximately 65 ns apart, but the DotClock duration is set to 25 ns. Therefore, the DotClock output drops to zero from a logic one state before the next activation signal is generated. In FIG. 3, the activation signals are still generated at approximately 65 ns intervals, which corresponds to the distance between marks on the track at a predetermined speed, but the duration of the DotClock output is approximately 75 ns. Therefore, if an additional activation signal is generated because a number of marks corresponding to the distance between signal generations has been detected, the DotClock output remains high for at least another 75 ns and possibly longer if another activation signal is generated as described above.

In operation, a known DotClock generator is operatively connected to a sintering head. The parameter for duration of the signal produced by this generator is set to be longer than the distance between the generation of the activation signals. Thereafter, the controller provides the starting position for the generation of the activation signals and the number of DotClock signals needed to expose the full length of the circuit. The DotClock generator then uses the encoder data to determine when the circuit has reached the sintering head and generates the identified number of activation signals separated by the predetermined generation distance so the sintering head generates light strobes to solidify the conductive ink pattern. Thus, the DotClock output remains high until the entire length of the circuit has been exposed and the flexible substrate exits the sintering head. The DotClock generator stops generating activation signals until another printed substrate is ready to enter the sintering head. In this manner, the DotClock generator 120 precisely commences sintering head operation when the substrate has entered the sintering head and precisely deactivates the sintering head when the entire length of the circuit has been exposed. This embodiment of a DotClock generator produces activation signals of different durations for variable operation of the sintering head to expose printed electrical circuit patterns of different lengths.

It will be appreciated that variants of the above-disclosed and other features, and functions, or alternatives thereof, may be desirably combined into many other different systems or applications. Various presently unforeseen or unanticipated alternatives, modifications, variations, or improvements therein may be subsequently made by those skilled in the art, which are also intended to be encompassed by the following claims.

What is claimed is:

1. A method for generating activation signals having a predetermined duration in a printer comprising:
   setting a distance between generation of activation signals for a first component to be a first determined distance;
   setting a duration of each activation signal for the first component to be longer than a time period corresponding to the first predetermined distance;
   identifying a number of activation signals that operate the first component for processing a predetermined length of a substrate;
   generating a first activation signal for the first component in response to the substrate reaching the first component; and
   continuing to generate additional activation signals for the first component as the first predetermined distance is reached following generation of each activation signal until the identified number of activation signals have been generated.

2. The method of claim 1 further comprising:
   receiving positional data from an encoder corresponding to movement of the substrate through the printer in a process direction; and
   generating the additional activation signals with reference to the positional data from the encoder indicating the first predetermined distance has been reached following one of the additional activation signal generations.

3. The method of claim 2 further comprising:
   setting a distance between generation of activation signals for a second component to be a second determined distance, the second predetermined distance being different than the first predetermined distance;
   setting the duration of each activation signal for the second component to be shorter than a time period corresponding to the second predetermined distance to enable each activation signal to terminate prior to the second predetermined distance being reached;
   generating a first activation signal for the second component as a substrate approaches the second component; and
   continuing to generate activation signals for the second component at the second predetermined distance following a previous activation signal generation and the substrate is still opposite the second component.

4. The method of claim 3 further comprising:
   receiving positional data from the encoder corresponding to movement of the substrate in the process direction past the second component; and
   ceasing generation of activation signals until the positional data indicates the substrate has at least traveled the second predetermined distance.

5. The method of claim 4 further comprising:
   setting the distance to the first determined distance or the second predetermined distance with reference to a switch.

6. The method of claim 5 wherein the encoder is a linear encoder.

7. The method of claim 6 wherein the first component is a sintering head.

8. The method of claim 7 wherein the second component is a printhead.

9. A system for forming electrical circuits on a substrate comprising:
   a cart configured to move the substrate along a track past a first component;
   a first component configured to treat the substrate as the cart passes the first component; and
   a controller configured to:
     set a distance between generation of activation signals for the first component to be a first determined distance;
     set a duration of each activation signal for the first component to be longer than a time period corresponding to the first predetermined distance;
     identify a number of activation signals that operate the first component for processing a predetermined length of a substrate;
     generate a first activation signal for the first component as the substrate approaches the first component; and
     continue to generate additional activation signals for the first component as the first predetermined distance is reached following generation of each activation signal until the identified number of activation signals have been generated.

10. The system of claim 9 further comprising:
an encoder configured to generate positional data indicating movement of the substrate in a process direction past the first component; and
the controller is further configured to:
generate the additional activation signals with reference to the positional data from the encoder indicating the first predetermined distance has been reached following one of the additional activation signal generations.

11. The system of claim 10 further comprising:
a second component positioned along the track to treat the substrate before the first component treats the substrate; and
the controller is further configured to:
set a distance between generation of activation signals for the second component to be a second determined distance, the second predetermined distance being different than the first predetermined distance;
set the duration of each activation signal for the second component to be shorter than a time period corresponding to the second predetermined distance to enable each activation signal to terminate prior to the second predetermined distance being reached;
generate a first activation signal for the second component as the substrate approaches the second component; and
continue to generate activation signals for the second component at the second predetermined distance following a previous generation of the activation signal and the substrate is still opposite the second component.

12. The system of claim 11, the controller being further configured to:
cease generation of activation signals until the positional data from the encoder indicates the substrate has at least traveled the second predetermined distance.

13. The system of claim 12 further comprising:
a switch configured to generate a signal indicative of whether the distance is to be set to the first determined distance or the second predetermined distance; and
the controller is further configured to set the distance to the first determined distance or the second predetermined distance with reference to the signal generated by the switch.

14. The system of claim 13 wherein the encoder is a linear encoder.

15. The system of claim 14 wherein the first component is a sintering head.

16. The system of claim 15 wherein the second component is a printhead.

17. A printing system for forming electrical circuits on a substrate comprising:
a cart configured to move the substrate along a track past a sintering head;
a sintering head configured to treat an electrical circuit on the substrate; and
a controller configured to:
set a distance between generation of activation signals for the sintering head to be a first determined distance;
set a duration of each activation signal for the sintering head to be longer than a time period corresponding to the first predetermined distance;
identify a number of activation signals that operate the sintering head for processing a predetermined length of a substrate;
generate a first activation signal for the sintering head as the substrate approaches the sintering head; and
continue to generate additional activation signals for the sintering head as the first predetermined distance is reached following generation of each activation signal until the identified number of activation signals have been generated.

18. The printing system of claim 17 further comprising:
an encoder configured to generate positional data indicating movement of the substrate in a process direction past the sintering head; and
the controller is further configured to:
generate the additional activation signals with reference to the positional data from the encoder indicating the first predetermined distance has been reached following one of the additional activation signal generations.

19. The printing system of claim 18 further comprising:
a printhead positioned to eject ink onto the substrate prior to the substrate being treated by the sintering head; and
the controller is further configured to:
set a distance between generation of activation signals for the printhead to be a second determined distance, the second predetermined distance being different than the first predetermined distance;
set the duration of each activation signal for the printhead to be shorter than a time period corresponding to the second predetermined distance to enable each activation signal to terminate prior to the second predetermined distance being reached;
generate a first activation signal for the printhead as the substrate approaches the printhead; and
continue to generate activation signals for the printhead at the second predetermined distance following a previous generation of the activation signal and the substrate is still opposite the printhead.

20. The printing system of claim 19, the controller is further configured to:
cease generation of activation signals until the positional data from the encoder indicates the substrate has at least traveled the second predetermined distance.

21. The printing system of claim 20 further comprising:
a switch configured to generate a signal indicative of whether the distance is to be set to the first determined distance or the second predetermined distance; and
the controller is further configured to set the distance to the first determined distance or the second predetermined distance with reference to the signal generated by the switch.

22. The printing system of claim 21 wherein the encoder is a linear encoder.

* * * * *